(12) United States Patent
Zhang

(10) Patent No.: US 10,747,346 B2
(45) Date of Patent: Aug. 18, 2020

(54) ARRAY SUBSTRATE AND TOUCH DISPLAY DEVICE

(71) Applicant: SHENZHEN CHINA STAR OPTOELECTRONICS TECHNOLOGY CO., LTD., Shenzhen, Guangdong (CN)

(72) Inventor: Yuan Zhang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 281 days.

(21) Appl. No.: 15/776,285

(22) PCT Filed: Mar. 27, 2018

(86) PCT No.: PCT/CN2018/080668
§ 371 (c)(1),
(2) Date: May 15, 2018

(87) PCT Pub. No.: WO2019/174067
PCT Pub. Date: Sep. 19, 2019

(65) Prior Publication Data
US 2020/0201464 A1 Jun. 25, 2020

(30) Foreign Application Priority Data

Mar. 16, 2018 (CN) .......................... 2018 1 0220937

(51) Int. Cl.
*G06F 3/041* (2006.01)
*G06F 3/042* (2006.01)
(Continued)

(52) U.S. Cl.
CPC ........ *G06F 3/0412* (2013.01); *G02F 1/13318* (2013.01); *G02F 1/13338* (2013.01);
(Continued)

(58) Field of Classification Search
CPC ....... G02F 1/13338; G02F 2001/13312; G02F 1/1362; G06F 3/0412; G06F 3/042; G06F 2203/04106; G06F 1/26; G06F 3/044
See application file for complete search history.

(56) References Cited

U.S. PATENT DOCUMENTS

2003/0156087 A1 * 8/2003 Boer .................. G06F 1/1611
345/92
2006/0033016 A1 * 2/2006 Ogawa .................. G06F 3/042
250/221
(Continued)

FOREIGN PATENT DOCUMENTS

CN 102004363 A 4/2011
CN 102955311 A 3/2013
(Continued)

*Primary Examiner* — Sanjiv D. Patel
(74) *Attorney, Agent, or Firm* — Leong C. Lei

(57) ABSTRACT

The invention provides an array substrate and touch display device. The array substrate comprises: a plurality of sub-pixel units arranged in array, a plurality of touch sensing lines and DC power lines; a touch sensing line being provided for each column of sub-pixel units, and a DC power line being provided for each row of sub-pixel units, each sub-pixel unit comprising a photosensitive TFT, and the photosensitive TFT having a floating gate, a source electrically connected to the corresponding DC power line, and a drain electrically connected to the corresponding touch sensing line. The photosensitive TFT absorbs infrared radiation emitted by biological being when touched by biological being, thereby achieving conduction to transmit the voltage on DC power line to touch sensing line to complete touch sensing. The touch function is integrated into sub-pixel unit. No additional touch panel is required, which can reduce production cost and prevent erroneous operation.

15 Claims, 2 Drawing Sheets

(51) Int. Cl.
*G06F 3/044* (2006.01)
*G02F 1/1333* (2006.01)
*H01L 27/144* (2006.01)
*H01L 27/146* (2006.01)
*G02F 1/133* (2006.01)

(52) U.S. Cl.
CPC ............ *G06F 3/042* (2013.01); *G06F 3/0443* (2019.05); *H01L 27/1443* (2013.01); *H01L 27/14669* (2013.01); *G02F 2201/083* (2013.01)

(56) References Cited

U.S. PATENT DOCUMENTS

| | | | |
|---|---|---|---|
| 2007/0109239 A1* | 5/2007 | den Boer | G06F 3/042 |
| | | | 345/87 |
| 2007/0252005 A1 | 11/2007 | Konicek | |
| 2009/0248344 A1* | 10/2009 | Hirabayashi | G09G 3/3648 |
| | | | 702/85 |
| 2009/0295692 A1* | 12/2009 | Lee | G02F 1/13338 |
| | | | 345/87 |
| 2011/0262934 A1* | 10/2011 | Kim | G01N 33/6896 |
| | | | 435/7.1 |
| 2014/0264501 A1* | 9/2014 | Na | H01L 31/062 |
| | | | 257/290 |
| 2018/0203537 A1* | 7/2018 | Kim | G06F 3/042 |

FOREIGN PATENT DOCUMENTS

| | | |
|---|---|---|
| CN | 103728760 A | 4/2014 |
| CN | 103809784 A | 5/2014 |
| CN | 105974637 A | 9/2016 |

* cited by examiner

ARRAY SUBSTRATE AND TOUCH DISPLAY DEVICE

BACKGROUND OF THE INVENTION

1. Field of the Invention

The present invention relates to the field of display and, in particular, to the field of manufacturing method for flexible display panel and flexible display panel.

2. The Related Arts

As the display technology progresses, the liquid crystal display (LCD) panel technology, with the advantages of high display quality, power-saving, thinness and wide application, is widely applied to mobile phones, TVs, PDAs, digital cameras, notebook PCs, desktop PCs, and other consumer electronic products and becomes the mainstream of the display devices.

The touch panel provides a new human-machine interacting interface, more direct and more user-friendly. The integration of touch panel and flat display device into a touch display device enables the flat display device to have touch control function so that the user can use finger or touch pen to input, and the operation becomes simple and intuitive.

At present, the LCDs and touch panels have been widely accepted and used by users and have respectively replaced the conventional cathode ray tubes (CRT) and physical keyboard input devices. The earlier touch display device usually uses a separate touch screen; that is, the touch panel is manufactured separately from the liquid crystal panel, and then assembled together. The touch display device manufactured by adopting the above approach is relatively thick, and more glass and thin films are used. The transmittance and contrast of the liquid crystal panel are also significantly reduced, and due to the separate manufacturing, the cost is high and the market competitive edge drops. To solve the above problems, a lighter and thinner touch display device with better display effect and low cost is developed. The embedded touch technology emerges as the demands require. The so-called embedded touch technology combines the touch panel and the liquid crystal panel as an integration, and the touch panel function is embedded in the liquid crystal panel, so that the liquid crystal panel has the function of displaying and sensing the touch input at the same time.

However, regardless of a separate touch display or an embedded touch display, it is necessary to provide a device for determining a touch area based on a change in resistance characteristic or a change in capacitance characteristic in a display area, which has a high production cost, and the above devices are prone to errors in the touch control process and fail to identify whether the user is operating or other objects are inadvertently touched, which leads to erroneous operation.

SUMMARY OF THE INVENTION

The primary object of the present invention is to provide an array substrate, able to integrate the touch function to the sub-pixel unit to reduce production cost and prevent erroneous operation.

Another object of the present invention is to provide a touch display device, able to integrate the touch function to the sub-pixel unit to reduce production cost and prevent erroneous operation.

To achieve the above objects, the present invention provides an array substrate, which comprises a plurality of sub-pixel units arranged in an array, a plurality of touch sensing lines and a plurality of direct current (DC) power lines;

a touch sensing line being provided for each column of sub-pixel units, and a DC power line being provided for each row of sub-pixel units, each sub-pixel unit comprising a photosensitive thin film transistor (TFT), and the photosensitive TFT having a floating gate, a source electrically connected to the DC power line corresponding to the row where the sub-pixel unit located, and a drain electrically connected to the touch sensing line corresponding to the column where the sub-pixel unit located.

According to a preferred embodiment of the present invention, the array substrate further comprises: a plurality of data lines and a plurality of scan lines, one data line provided for each column of sub-pixel units, one scan line provided for each row of sub-pixel units, each sub-pixel unit further comprising: a switching TFT and a pixel electrode, the switching TFT having a gate electrically connected to the scan line corresponding to the row where the sub-pixel unit located, a source electrically connected to the data line corresponding to the column where the sub-pixel unit located, and a drain electrically connected to the pixel electrode of the sub-pixel unit.

According to a preferred embodiment of the present invention, a channel of the photosensitive TFT is made of amorphous silicon (a-Si).

According to a preferred embodiment of the present invention, the photosensitive TFT is an N-type TFT.

According to a preferred embodiment of the present invention, the plurality of touch sensing lines are electrically connected to a touch sensing chip.

According to a preferred embodiment of the present invention, the touch sensing chip is integrated into a timing controller.

According to a preferred embodiment of the present invention, the DC power line, the scan line, the gate of the photosensitive TFT and the gate of the switching TFT are all located in a first metal layer, and the touch sensing line, the data line, the source and the drain of the photosensitive TFT, and the source and the drain of the drain and the switching TFT are located in a second metal layer, and the first metal layer and the second metal layer are insulated and stacked.

According to a preferred embodiment of the present invention, a material for the first metal layer and the second metal layer is a combination of one or more of molybdenum, aluminum, and copper.

According to a preferred embodiment of the present invention, the pixel electrode is made of indium tin oxide (ITO).

The present invention also provides a touch display device, which comprises the above array substrate.

The present invention also provides an array substrate, which comprises a plurality of sub-pixel units arranged in an array, a plurality of touch sensing lines and a plurality of direct current (DC) power lines;

a touch sensing line being provided for each column of sub-pixel units, and a DC power line being provided for each row of sub-pixel units, each sub-pixel unit comprising a photosensitive thin film transistor (TFT), and the photosensitive TFT having a floating gate, a source electrically connected to the DC power line corresponding to the row where the sub-pixel unit located, and a drain electrically connected to the touch sensing line corresponding to the column where the sub-pixel unit located;

further comprising: a plurality of data lines and a plurality of scan lines, one data line provided for each column of sub-pixel units, one scan line provided for each row of sub-pixel units, each sub-pixel unit further comprising: a switching TFT and a pixel electrode, the switching TFT having a gate electrically connected to the scan line corresponding to the row where the sub-pixel unit located, a source electrically connected to the data line corresponding to the column where the sub-pixel unit located, and a drain electrically connected to the pixel electrode of the sub-pixel unit;

wherein a channel of the photosensitive TFT being made of amorphous silicon (a-Si);

wherein the photosensitive TFT being an N-type TFT;

wherein the plurality of touch sensing lines are electrically connected to a touch sensing chip.

The present invention provides the following advantages:

The present invention provides an array substrate, comprising a plurality of sub-pixel units arranged in an array, a plurality of touch sensing lines, and a plurality of DC power lines; a touch sensing line being provided for each column of sub-pixel units, and a DC power line being provided for each row of sub-pixel units, each sub-pixel unit comprising a photosensitive TFT, and the photosensitive TFT having a floating gate, a source electrically connected to the DC power line corresponding to the row where the sub-pixel unit located, and a drain electrically connected to the touch sensing line corresponding to the column where the sub-pixel unit located. The photosensitive TFT can absorb the infrared radiation emitted by biological being when touched by the biological being, thereby achieving conduction to transmit the voltage on the DC power line to the touch sensing line to complete the touch sensing. The touch function is integrated into the sub-pixel unit. No additional touch panel is required, which can reduce the production cost and prevent erroneous operation. The present invention also provides a touch display device, which integrates the touch function into sub-pixel units, can reduce the production cost and prevent erroneous operation.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 1:
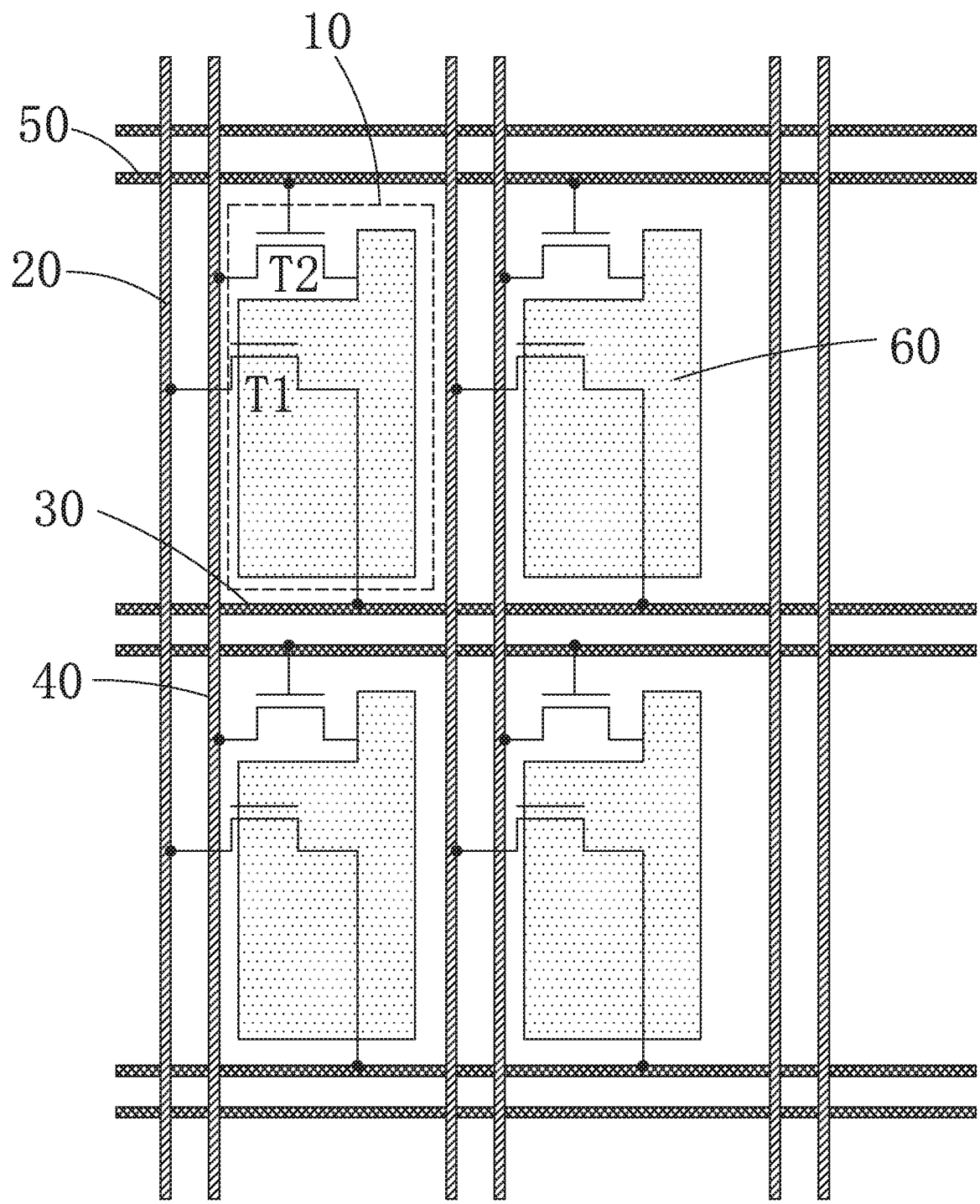
FIG. 1 is a schematic view showing the array substrate according to an exemplary embodiment of the present invention.

As shown in FIG. 1, the present invention provides an array substrate, which comprises: a plurality of sub-pixel units 10 arranged in an array, a plurality of touch sensing lines 20 and a plurality of direct current (DC) power lines 30;

wherein a touch sensing line 20 is provided for each column of sub-pixel units 10, and a DC power line 30 is provided for each row of sub-pixel units 10; each sub-pixel unit 10 comprises a photosensitive thin film transistor (TFT) T1, and the photosensitive TFT T1 has a floating gate, a source electrically connected to the DC power line 30 corresponding to the row where the sub-pixel unit 10 is located, and a drain electrically connected to the touch sensing line 20 corresponding to the column where the sub-pixel unit 10 is located.

Specifically, to accomplish the touch operation recognition also requires disposing a touch sensing chip electrically connected with the touch sensing line 20 for identifying the touch position according to the voltage received by the touch sensing line 20. Specifically, the touch sensing chip can be disposed separately or integrated into a timing controller that controls display timing.

It should be noted that the photosensitive TFT is capable of absorbing infrared radiation emitted by a biological object when touched by a biological being. The infrared radiation excites electrons of a semiconductor layer of the photosensitive TFT. When the electrons in the semiconductor layer are accumulated to a certain extent, the source and the drain of the photosensitive TFT are turned on, so that the voltage on the DC power line 30 electrically connected with the source is transmitted to the touch sensing line 20. The touch sensing line 20 further transmits the voltage to the touch sensing chip. After the touch sensing chip receives the voltage, the position of the touch by the biologic being can be recognized and the touch operation is achieved.

Moreover, the infrared radiation is characteristic unique to living being. Generally, a non-living being cannot emit infrared radiation, and thus it cannot trigger the conduction of the photosensitive TFT. Compared to a conventional capacitive or resistive touch sensing device, the touch sensing through the photosensitive TFT can effectively avoid false triggering, and can be directly integrated into the sub-pixel unit 10, without additional production of a touch panel or a separate touch circuit, which can reduce production costs and improve product competitiveness Clearly, to achieve normal display function, the array substrate further comprises: a plurality of data lines 40 and a plurality of scan lines 50, one data line 40 corresponding to each column of sub-pixel units 10, one scan line 50 corresponding to each row of sub-pixel units 50; each sub-pixel unit 10 further comprises: a switching TFT T2 and a pixel electrode 60, the switching TFT T2 having a gate electrically connected to the scan line 50 corresponding to the row where the sub-pixel unit 10 located, a source electrically connected to the data line 40 corresponding to the column where the sub-pixel unit 10 located, and a drain electrically connected to the pixel electrode 60 of the sub-pixel unit 10.

Figure 2:
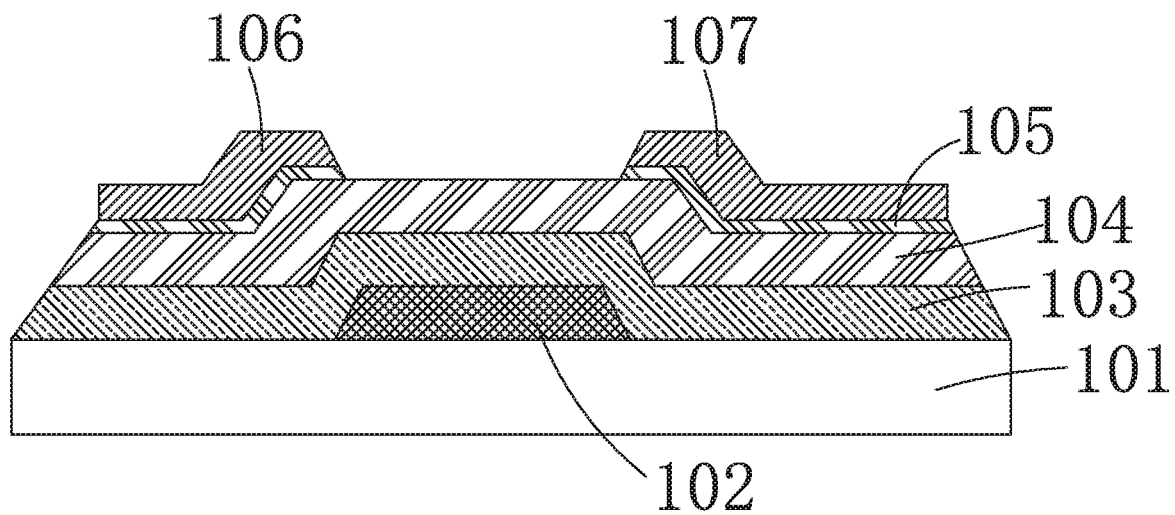
FIG. 2 is a schematic view showing the structure of photosensitive TFT of the array substrate according to an exemplary embodiment of the present invention.

Furthermore, a typical photosensitive TFT has a structure as shown in FIG. 2, which comprises: a substrate 101, a gate disposed 102 on the substrate 101, an insulating layer 103 covering the gate 102 and the substrate 101, a semiconductor on the insulating layer 103, and a source 106 and a drain 107 located respectively at two ends of the semiconductor layer 104 and mutually insulated. Also, a doped layer 105 is formed respectively between the source 106 and the semiconductor layer 104 and between the drain 107 and the semiconductor layer 104. The doped layer 105 is obtained by ion doping on the material of the semiconductor layer 104.

Preferably, the material for the semiconductor layer is amorphous silicon (a-Si); in other words, a channel of the photosensitive TFT T1 is made of a-Si. The ion doped to the doped layer 105 is N-type ion, i.e., the doped layer 105 is an N-type a-Si, that is, the photosensitive TFT T1 is an N-type TFT.

Specifically, when manufacturing, the DC power line 30, the scan line 50, the gate of the photosensitive TFT T1 and the gate of the switching TFT T2 are all located in a first metal layer, and the touch sensing line 20, the data line 40, the source and the drain of the photosensitive TFT T1, and the source and the drain of the drain and the switching TFT T2 are located in a second metal layer, and the first metal layer and the second metal layer are insulated and stacked.

Preferably, the first metal layer and the second metal layer are made of a material of a combination of one or more of molybdenum, aluminum, and copper. The pixel electrode 60 is made of indium tin oxide (ITO).

The present invention also provides a touch display device, which comprises the above array substrate. The process of touch sensing by the touch display device comprises: a biological being touches on the sub-pixel unit 10 of the touch display device, and infrared radiation is emitted to the photosensitive TFT T1; the photosensitive TFT T1 in the element unit 10 is turned on after absorbing infrared radiation, and the voltage on the DC power line 30 is transmitted to the touch sensing line 20 to achieve touch sensing.

In summary, the present invention provides an array substrate, comprising a plurality of sub-pixel units arranged in an array, a plurality of touch sensing lines, and a plurality of DC power lines; a touch sensing line being provided for each column of sub-pixel units, and a DC power line being provided for each row of sub-pixel units, each sub-pixel unit comprising a photosensitive TFT, and the photosensitive TFT having a floating gate, a source electrically connected to the DC power line corresponding to the row where the sub-pixel unit located, and a drain electrically connected to the touch sensing line corresponding to the column where the sub-pixel unit located. The photosensitive TFT can absorb the infrared radiation emitted by biological being when touched by the biological being, thereby achieving conduction to transmit the voltage on the DC power line to the touch sensing line to complete the touch sensing. The touch function is integrated into the sub-pixel unit. No additional touch panel is required, which can reduce the production cost and prevent erroneous operation. The present invention also provides a touch display device, which integrates the touch function into sub-pixel units, can reduce the production cost and prevent erroneous operation.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising: a plurality of sub-pixel units arranged in an array, a plurality of touch sensing lines and a plurality of direct current (DC) power lines;
   wherein each of the plurality of touch sensing lines is provided for one column of the array of the plurality of sub-pixel units, and each of the plurality of DC power lines is provided for one row of the array of the plurality of sub-pixel units, each of the plurality of sub-pixel units comprising a photosensitive thin film transistor (TFT), and the photosensitive TFT having a floating gate, a source electrically connected to the DC power line corresponding to the row where the sub-pixel unit is located, and a drain electrically connected to the touch sensing line corresponding to the column where the sub-pixel unit is located;
   wherein the photosensitive TFT comprises a metal block that is electrically isolated and is set in an electrically floating state to form the floating gate.

2. The array substrate as claimed in claim 1, further comprising: a plurality of data lines and a plurality of scan lines, one data line provided for each column of sub-pixel units, one scan line provided for each row of sub-pixel units, each sub-pixel unit further comprising a switching TFT and a pixel electrode, the switching TFT having a gate electrically connected to the scan line corresponding to the row where the sub-pixel unit is located, a source electrically connected to the data line corresponding to the column where the sub-pixel unit is located, and a drain electrically connected to the pixel electrode of the sub-pixel unit.

3. The array substrate as claimed in claim 1, wherein a channel of the photosensitive TFT is made of amorphous silicon (a-Si).

4. The array substrate as claimed in claim 1, wherein the photosensitive TFT is an N-type TFT.

5. The array substrate as claimed in claim 1, wherein the plurality of touch sensing lines are electrically connected to a touch sensing chip.

6. The array substrate as claimed in claim 5, wherein the touch sensing chip is integrated into a timing controller.

7. The array substrate as claimed in claim 2, wherein the DC power line, the scan line, the gate of the photosensitive TFT and the gate of the switching TFT are all located in a first metal layer, and the touch sensing line, the data line, the source and the drain of the photosensitive TFT, and the source and the drain of the switching TFT are located in a second metal layer, and the first metal layer and the second metal layer are insulated and stacked.

8. The array substrate as claimed in claim 7, wherein the first metal layer and the second metal layer are made of a combination of one or more of molybdenum, aluminum, and copper.

9. The array substrate as claimed in claim 2, wherein the pixel electrode is made of indium tin oxide (ITO).

10. A touch display device, comprising the array substrate as claimed in claim 1.

11. An array substrate, comprising: a plurality of sub-pixel units arranged in an array, a plurality of touch sensing lines and a plurality of direct current (DC) power lines;
wherein each of the plurality of touch sensing lines is provided for one column of the array of the plurality of sub-pixel units, and each of the plurality of DC power lines is provided for one row of the array of the plurality of sub-pixel units, each of the plurality of sub-pixel units comprising a photosensitive thin film transistor (TFT), and the photosensitive TFT having a floating gate, a source electrically connected to the DC power line corresponding to the row where the sub-pixel unit is located, and a drain electrically connected to the touch sensing line corresponding to the column where the sub-pixel unit is located;
wherein the photosensitive TFT comprises a metal block that is electrically isolated and is set in an electrically floating state to form the floating gate;
wherein the array substrate further comprises a plurality of data lines and a plurality of scan lines, one data line provided for each column of sub-pixel units, one scan line provided for each row of sub-pixel units, each sub-pixel unit further comprising a switching TFT and a pixel electrode, the switching TFT having a gate electrically connected to the scan line corresponding to the row where the sub-pixel unit is located, a source electrically connected to the data line corresponding to the column where the sub-pixel unit is located, and a drain electrically connected to the pixel electrode of the sub-pixel unit;
wherein a channel of the photosensitive TFT being made of amorphous silicon (a-Si);
wherein the photosensitive TFT being an N-type TFT;
wherein the plurality of touch sensing lines being electrically connected to a touch sensing chip.

12. The array substrate as claimed in claim 11, wherein the touch sensing chip is integrated into a timing controller.

13. The array substrate as claimed in claim 11, wherein the DC power line, the scan line, the gate of the photosensitive TFT and the gate of the switching TFT are all located in a first metal layer, and the touch sensing line, the data line, the source and the drain of the photosensitive TFT, and the source and the drain of the switching TFT are located in a second metal layer, and the first metal layer and the second metal layer are insulated and stacked.

14. The array substrate as claimed in claim 13, wherein the first metal layer and the second metal layer are made of a combination of one or more of molybdenum, aluminum, and copper.

15. The array substrate as claimed in claim 11, wherein the pixel electrode is made of indium tin oxide (ITO).

\* \* \* \* \*